United States Patent
Tsironis

(10) Patent No.: US 9,335,345 B1
(45) Date of Patent: *May 10, 2016

(54) METHOD FOR PLANARITY ALIGNMENT OF WAVEGUIDE WAFER PROBES

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 176 days.

This patent is subject to a terminal disclaimer.

(21) Appl. No.: 13/846,060

(22) Filed: Mar. 18, 2013

(51) Int. Cl.
*G01R 1/067* (2006.01)
*G01R 31/28* (2006.01)

(52) U.S. Cl.
CPC ........ *G01R 1/06705* (2013.01); *G01R 1/06772* (2013.01); *G01R 31/2822* (2013.01)

(58) Field of Classification Search
None
See application file for complete search history.

(56) References Cited

U.S. PATENT DOCUMENTS

| | | | | |
|---|---|---|---|---|
| 2,844,789 A * | 7/1958 | Allen | | 324/250 |
| 5,387,884 A * | 2/1995 | Porcello | | H01P 5/04 |
| | | | | 333/253 |
| 5,845,410 A * | 12/1998 | Boker | | B27B 25/10 |
| | | | | 33/469 |
| 7,528,322 B1 * | 5/2009 | Gretz | | H02G 3/121 |
| | | | | 174/481 |
| 7,791,438 B2 * | 9/2010 | Lau et al. | | 333/254 |
| 7,839,156 B2 * | 11/2010 | Yamada et al. | | 324/750.25 |
| 8,952,770 B2 * | 2/2015 | Lau | | H01P 1/042 |
| | | | | 333/254 |
| 2002/0011856 A1 * | 1/2002 | Huang | | G01R 1/06772 |
| | | | | 324/754.07 |
| 2003/0178988 A1 * | 9/2003 | Kim | | 324/158.1 |
| 2006/0022686 A1 * | 2/2006 | Fan et al. | | 324/754 |
| 2009/0079451 A1 * | 3/2009 | Campbell et al. | | 324/754 |
| 2009/0189623 A1 * | 7/2009 | Campbell et al. | | 324/754 |
| 2010/0001742 A1 * | 1/2010 | Strid et al. | | 324/601 |
| 2011/0025355 A1 * | 2/2011 | Liang | | G01R 1/06705 |
| | | | | 324/750.19 |
| 2012/0087569 A1 * | 4/2012 | O'Dell et al. | | 382/149 |

OTHER PUBLICATIONS

Cascade Mircotech wafer probes: http://www.cascademicrotech.com/products/probes/rf-microwave/infinity-probe/infinity-probe.
GGB wafer probes: http://www.ggb.com/40m.html.

* cited by examiner

*Primary Examiner* — Melissa Koval
*Assistant Examiner* — Felicia Farrow

(57) ABSTRACT

A "theta" angle adjustment method for waveguide probes uses an adjustable solid parallelepiped that allows the wafer probes to be fastened to the auxiliary equipment under correcting "theta" angles and a flange holding and securing bracket that allows one waveguide section to rotate against the other. The alignment procedure requires one of both flanges to have its aligning pin holes and fastening screw threads replaced by circular (oval) holes, allowing the waveguide sections to rotate axially against each-other. The Theta angle is adjusted by repeated trial and error fastening and unfastening the securing bracket under firm pressure of the probe body against the solid support parallelepiped.

7 Claims, 15 Drawing Sheets

Assembling bracket for holding waveguide flange

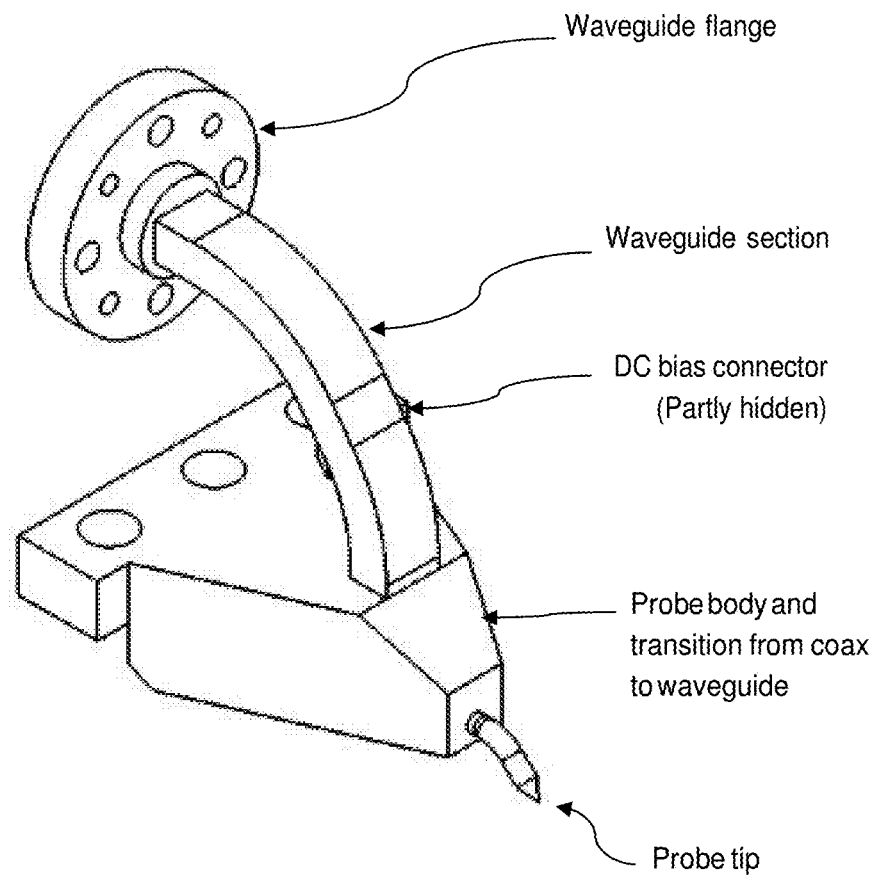
Figure 1, prior art: millimeter-wave (waveguide) wafer probe

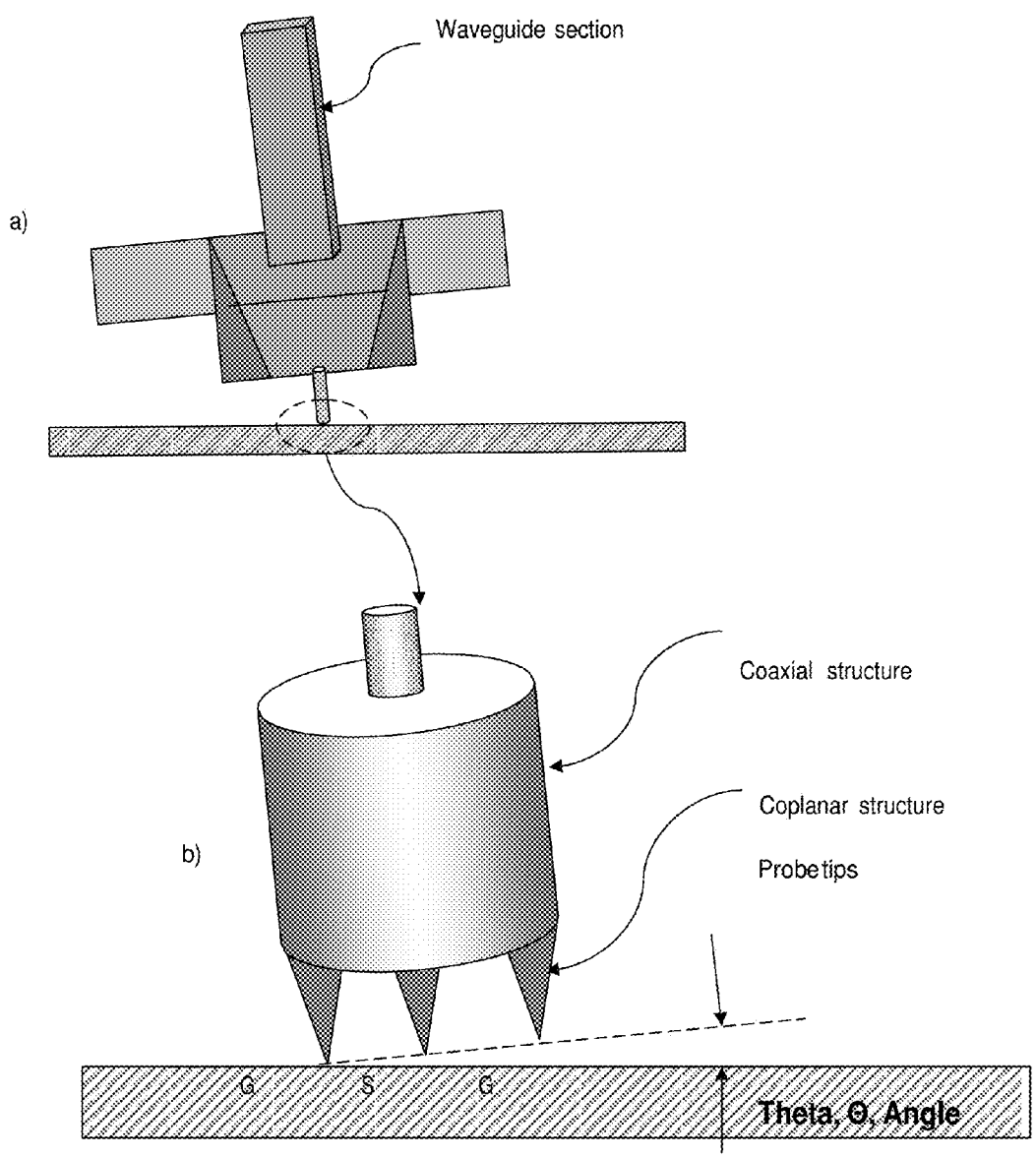
Figure 2 (prior art): Millimeter-wave waveguide wafer probe (schematics)

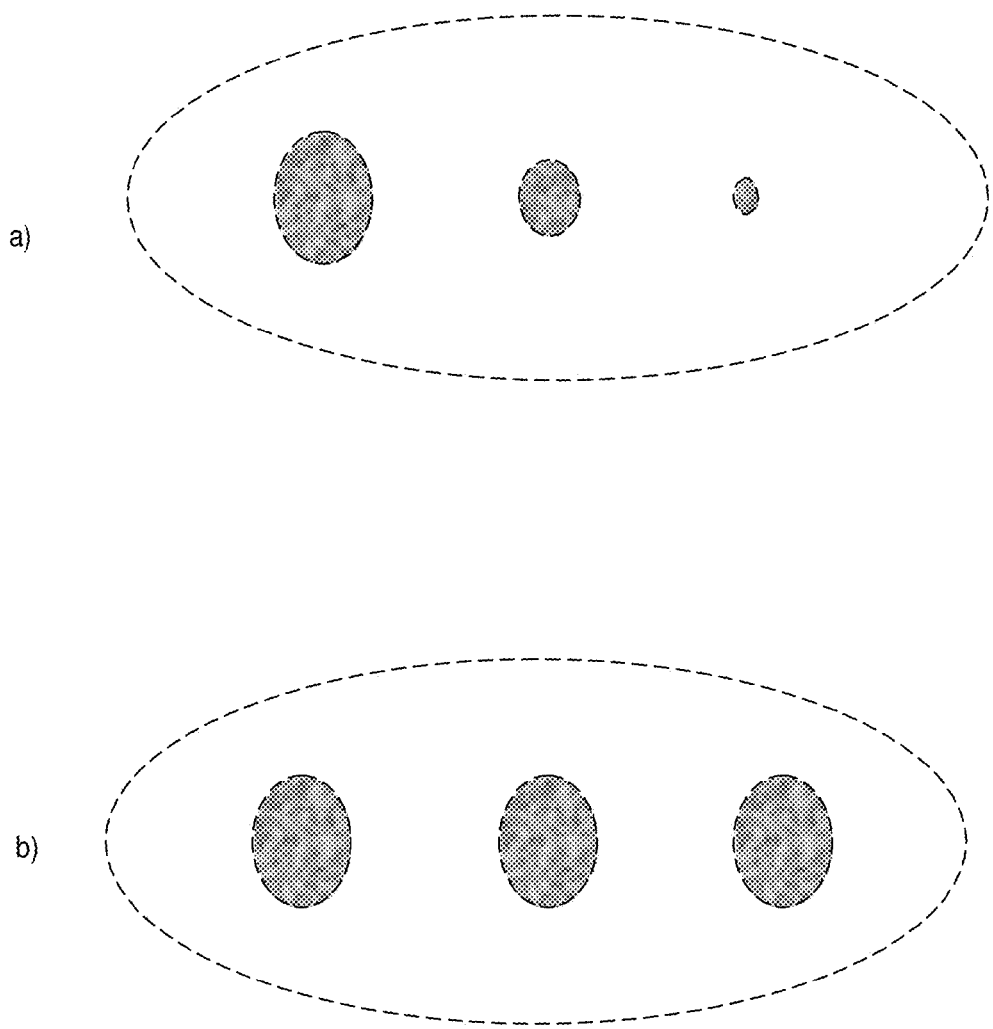
Figure 3 prior art: probe tip marks on wafer chip plots: a) misaligned, b) aligned

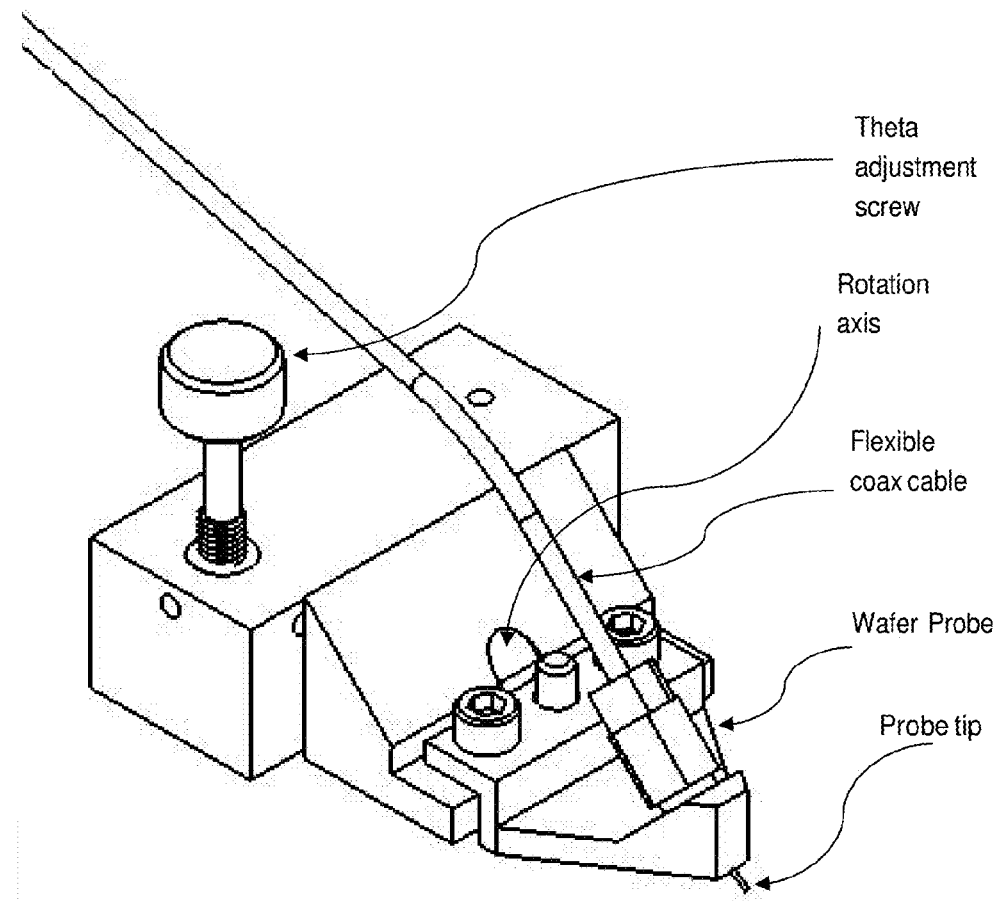
Figure 4, prior art: wafer probe mounting using flexible cable and theta adjustment

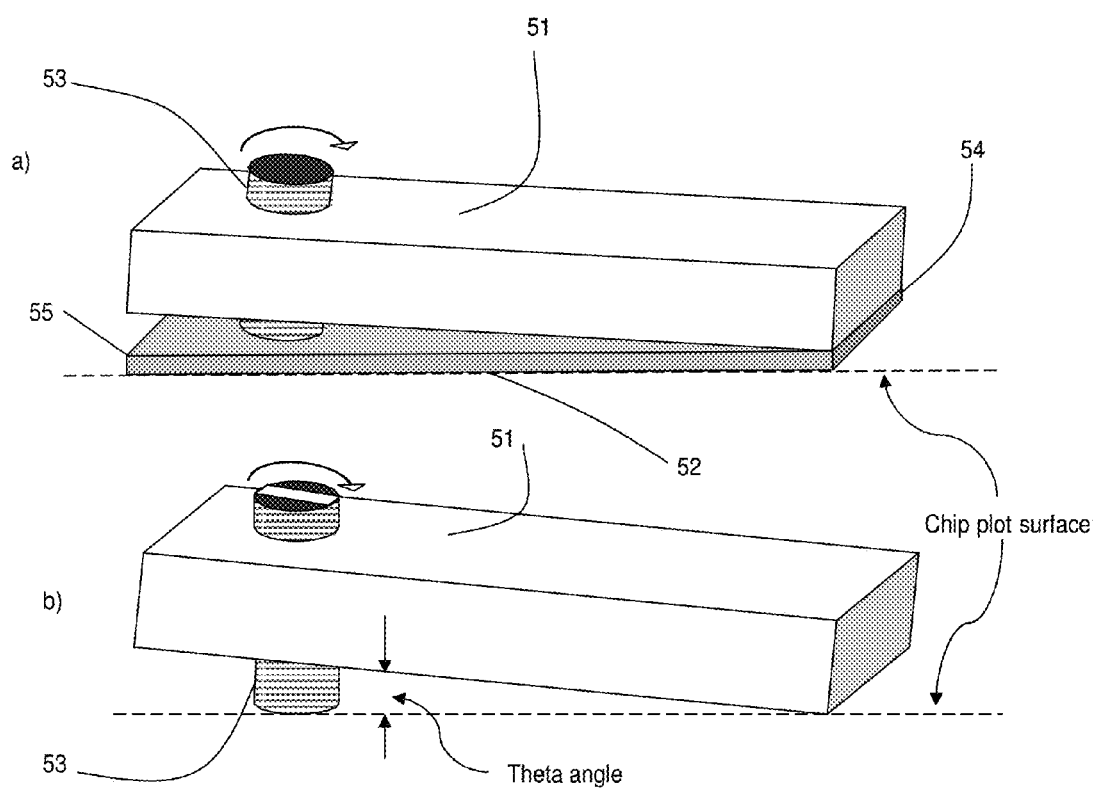
Figure 5: Theta angle alignment block

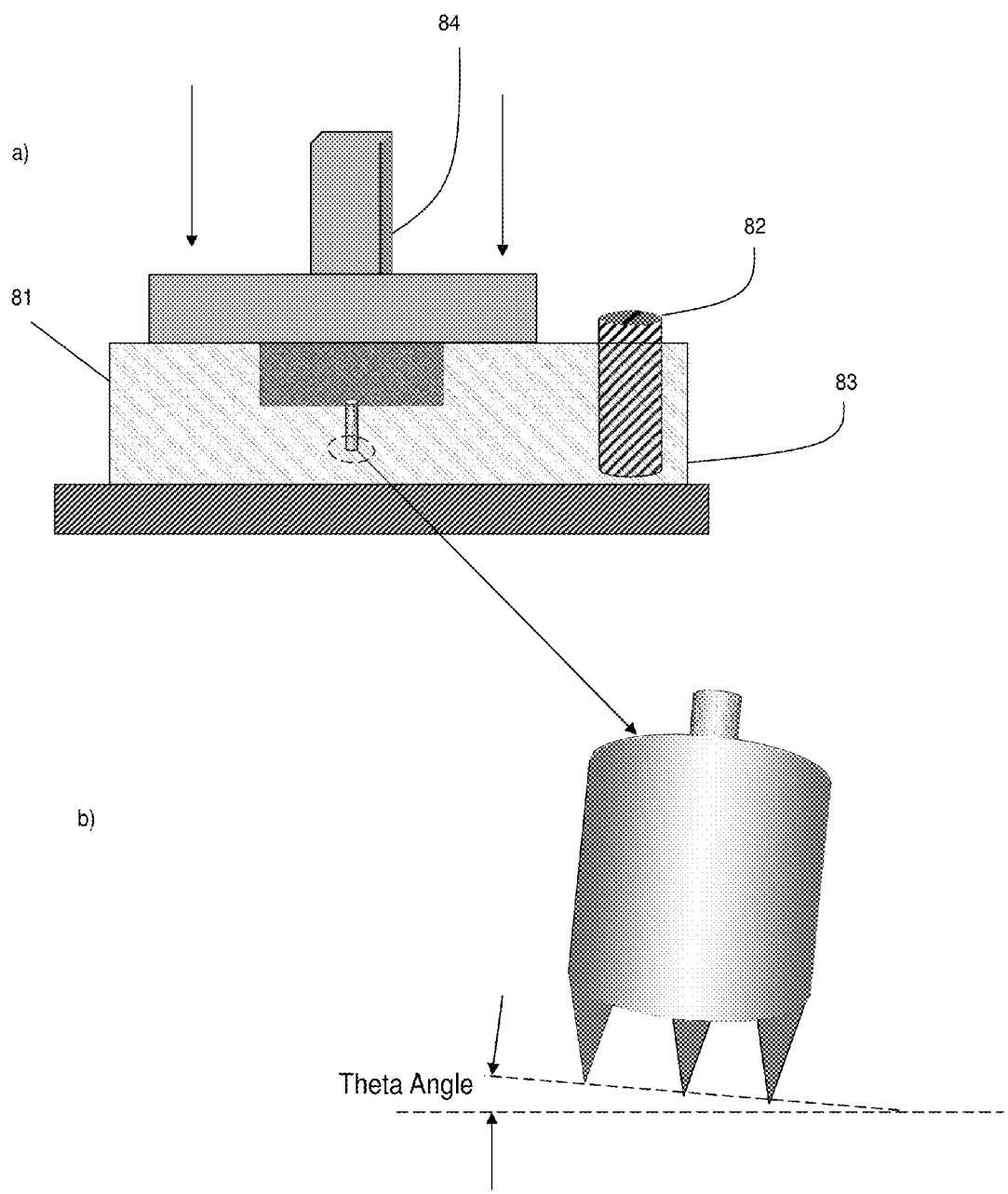
Figure 6: aligning wafer probe body flat on chuck surface; probe tips can be misaligned

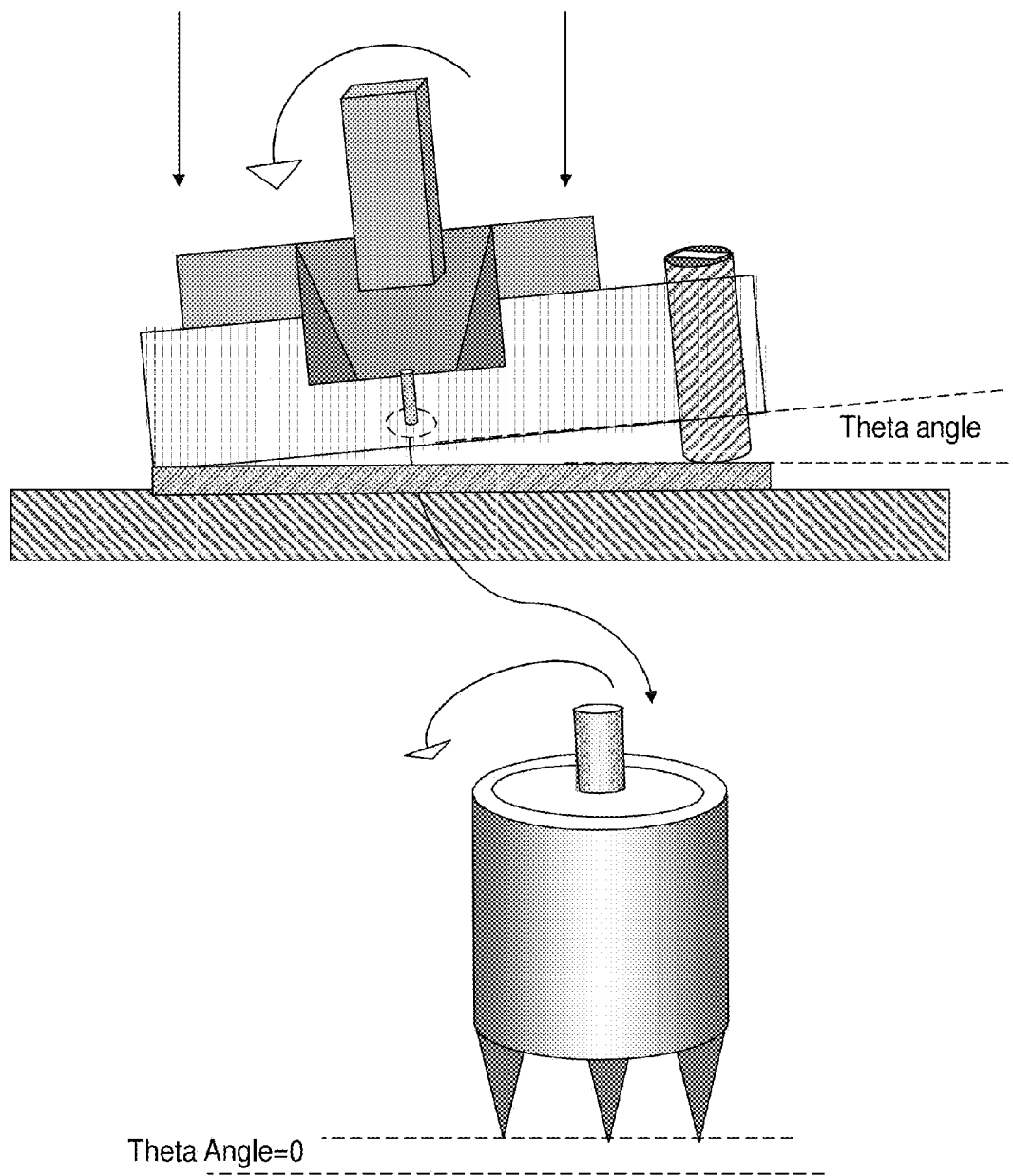
Figure 7: Corrected theta misalignment of probe tips

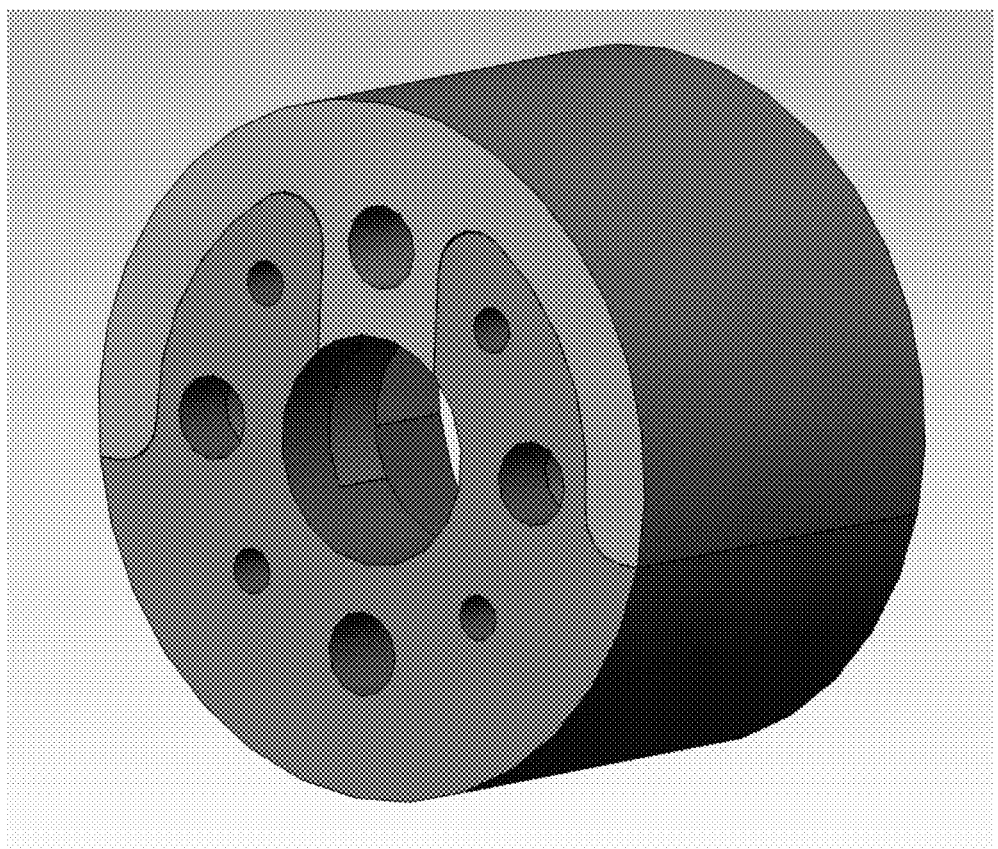
Figure 8: Bracket apparatus for holding rotating waveguide flange (assembled)

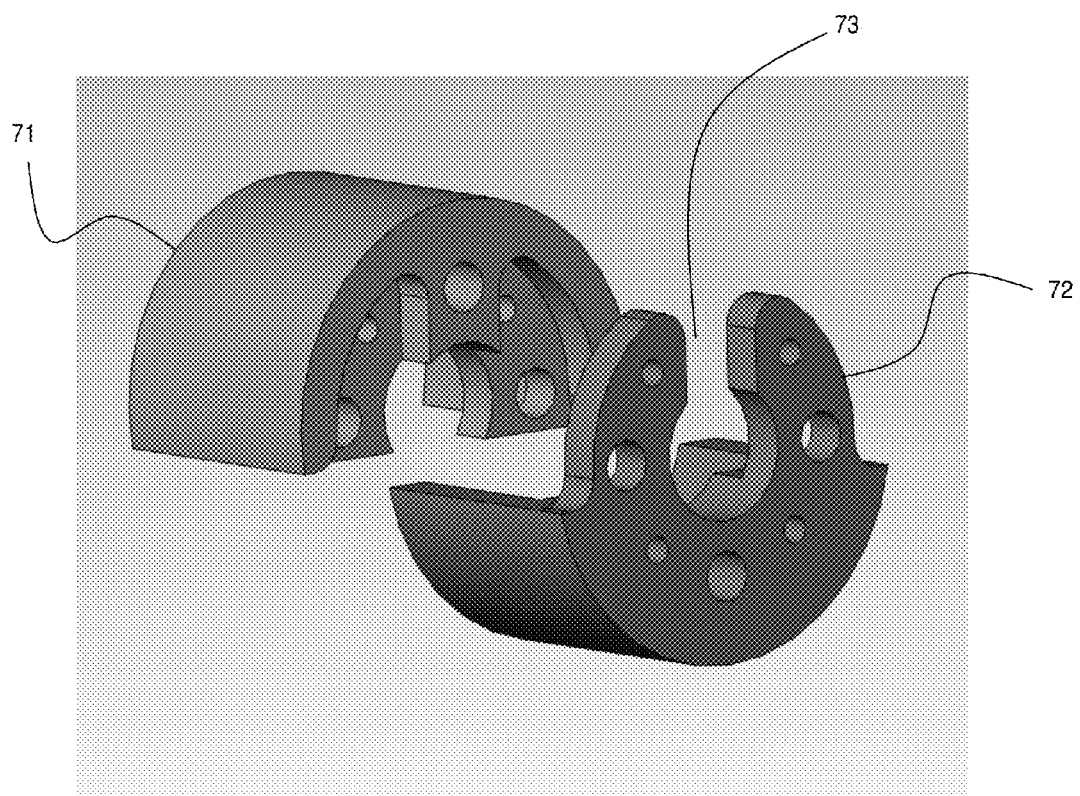
Figure 9: Bracket apparatus for holding waveguide flange (dis-assembled)

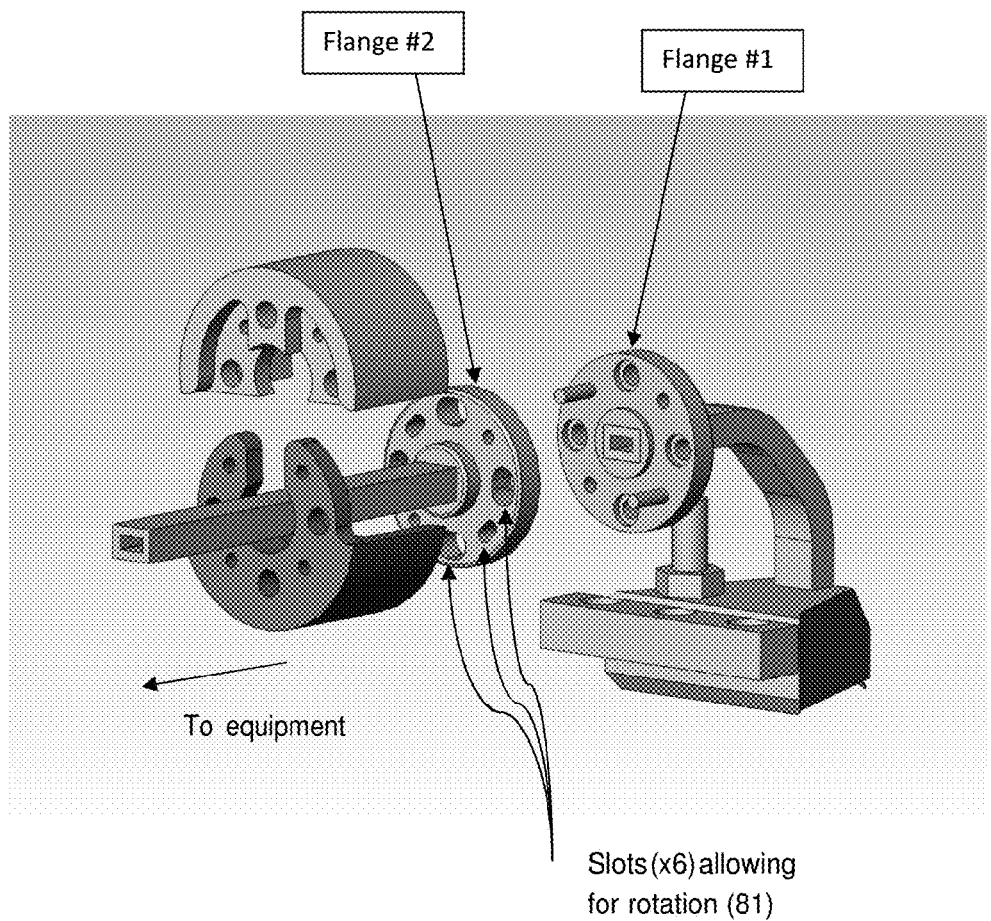
Figure 10: Assembling bracket for holding waveguide flange

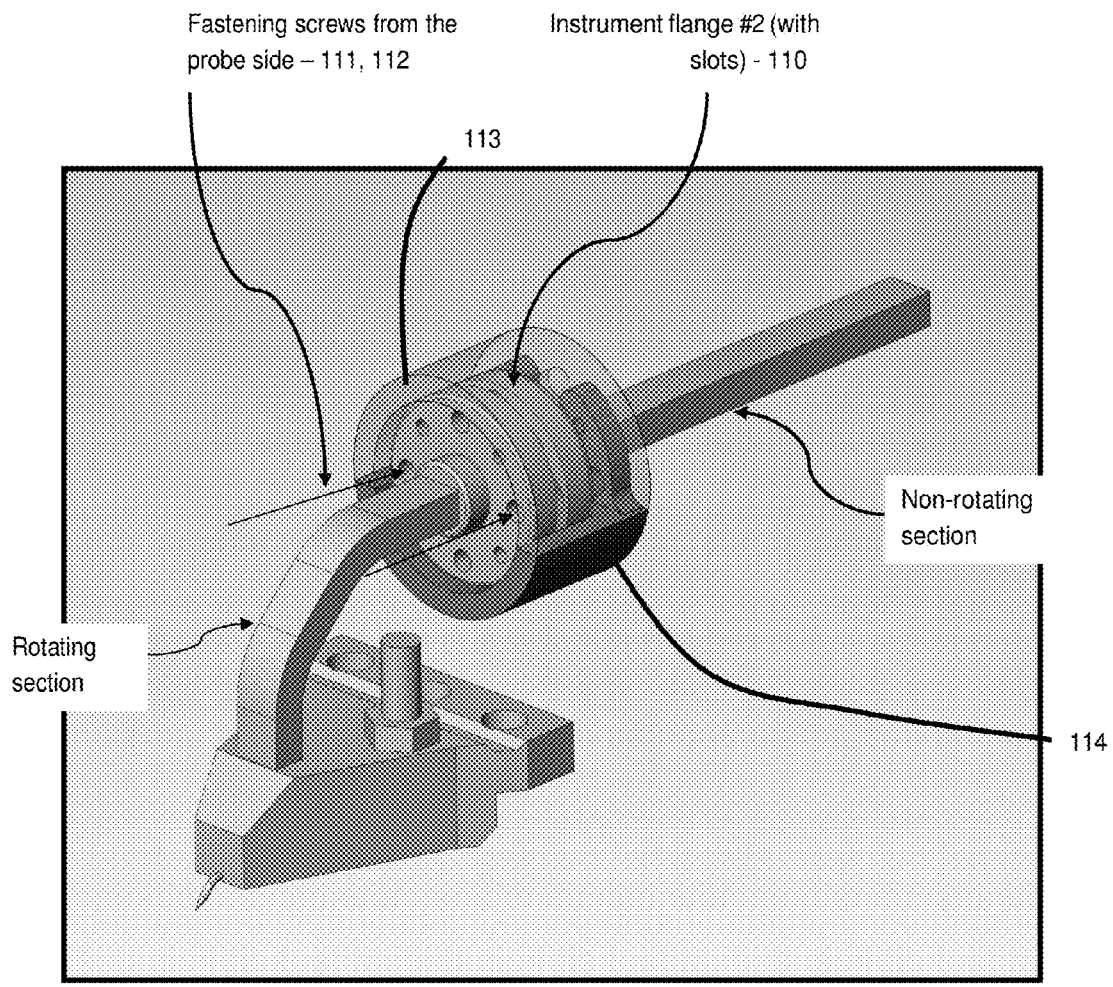
Figure 11: Bracket for holding wafer probe and waveguide flange (assembled)

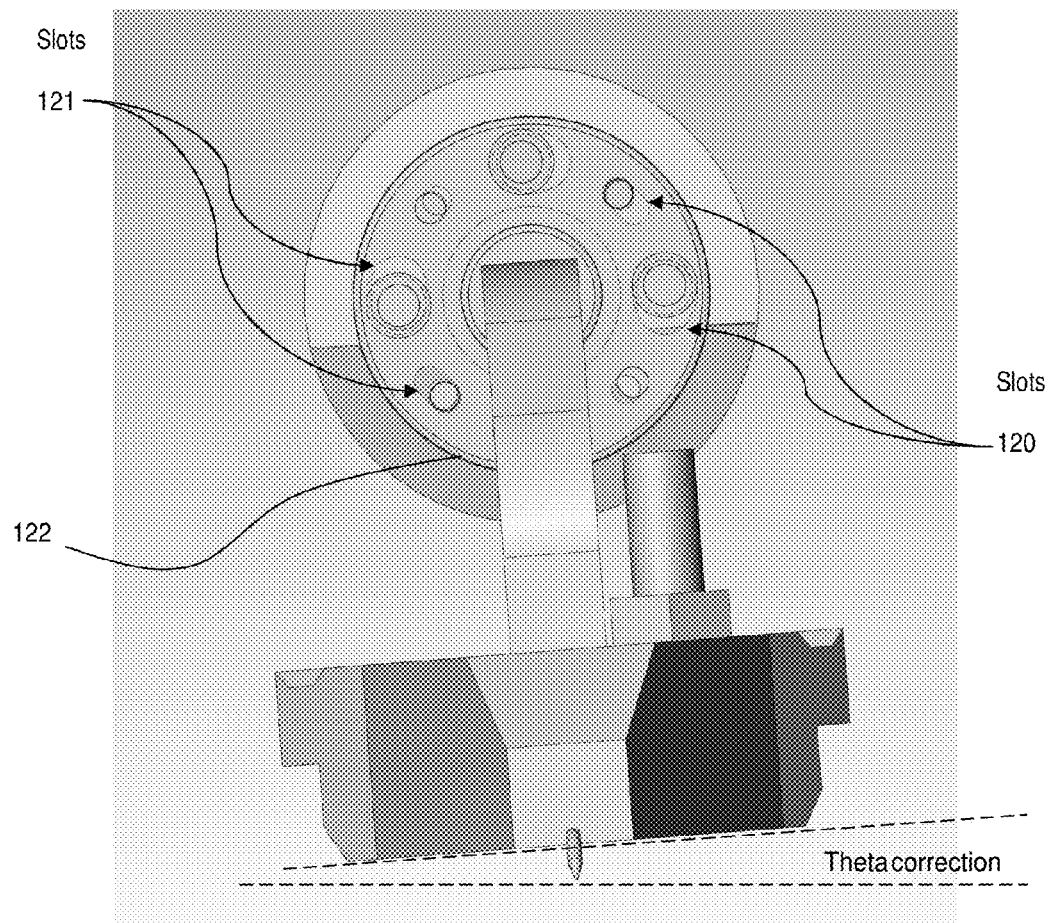
Figure 12: Waveguide probe tilted to allow for theta alignment

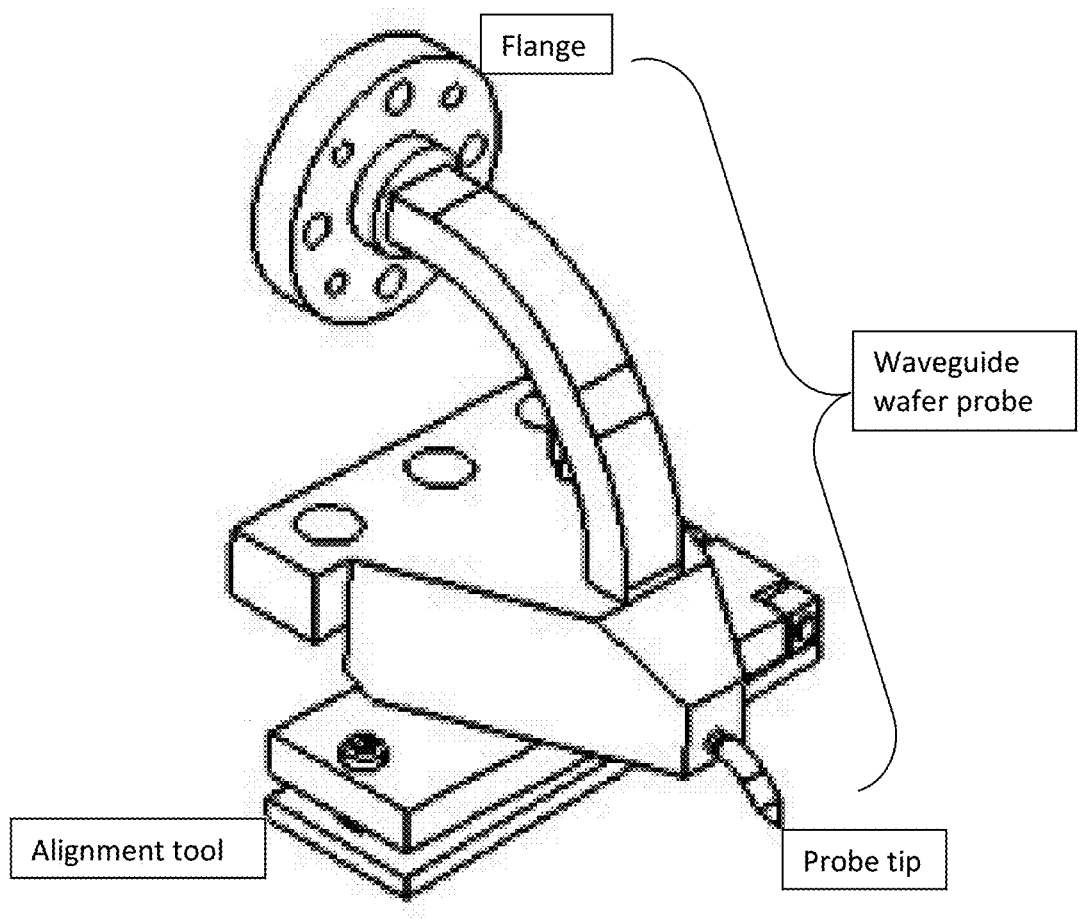
Figure 13: Alignment tool used with waveguide probe

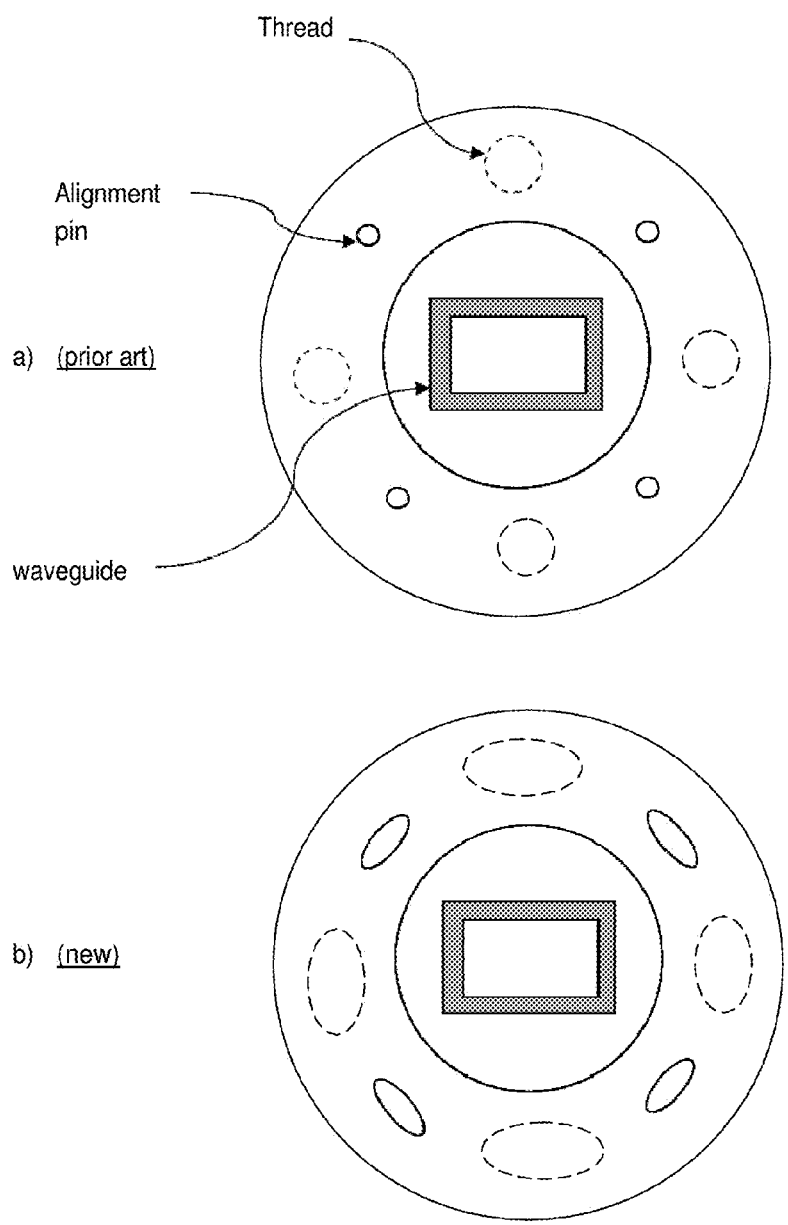
Figure 14: (partly prior art): Modification on one waveguide flange a) original, b) modified

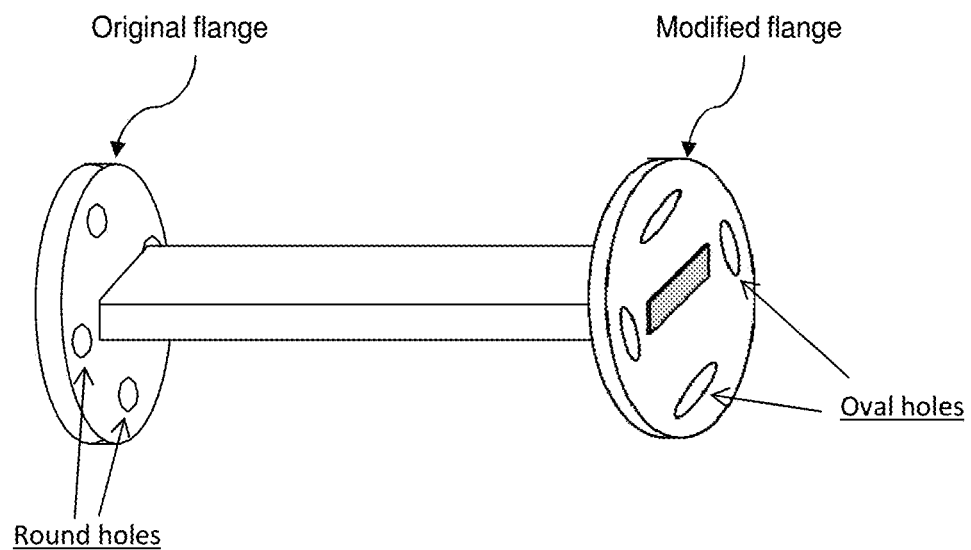
Figure 15: Waveguide flange insertion section

US 9,335,345 B1

METHOD FOR PLANARITY ALIGNMENT OF WAVEGUIDE WAFER PROBES

PRIORITY CLAIM

This application claims priority on provisional application 61/646,931 filed on May 22, 2012

CROSS-REFERENCE TO RELATED ARTICLES

[1] Cascade Microtech wafer probes: http://www.cascademicrotech.com/products/probes/rf-microwave/infinity-probe/infinity-probe
[2] GGB wafer probes: http://www.ggb.com/40m.html

BACKGROUND OF THE INVENTION

RF and Microwave transistor chips are best characterized "on wafer". This allows avoidance of parasitic connection elements, like wire bonds and fringe capacitors, which are associated with packaging the devices in order to mount them in test fixtures. It also allows a much larger number of devices to be tested "in situ" without having to laboriously slice the wafer, mount and wire-bond each individual chip. The "on wafer" testing is at this time the preferred testing method, except for very high power devices, beyond 10 Watt RF power. On-wafer testing is also the exclusive testing method in millimeter-wave frequencies, since device packaging is extremely difficult and the parasitic elements associated with the package (inductance of wire bonds and fringe capacitors of package housings) would falsify the measured data to the point of uselessness.

Only a few manufacturers [1, 2] offer wafer probes capable of reliably testing chips in millimeter-wave frequencies (frequency >40 GHz). The millimeter-wave waveguide probes (FIG. 1) are made, usually, using small coaxial cable sections with diameters of the order of 1 mm (0.04") or less that end into a "coplanar" structure, where the center conductor of the coaxial cable becomes the center conductor of the coplanar section and the ground mantle of the coaxial cable ends up as the ground plan of the coplanar (FIG. 2b). The simple reason is that this is a practical way for the RF signal to be injected and retrieved from planar micro-chips, where all RF contacts are on the same surface (Ground-Signal-Ground or "GSG" configuration). The coaxial cable is then coupled into a waveguide section and ends up at a waveguide flange (FIG. 1).

Therefore at least three connection points (probe tips) are necessary to establish a GSG (Ground-Signal-Ground) contact (FIG. 2b). Since three probe tips do not necessarily form a straight line and since the probes themselves may be imperfect, due to the microscopic structures (distance between probe tips of the order of 150 micrometers ~0.006") and manufacturing tolerances, it often happens that the contact between the probe tips and chip contact plots is uneven and unreliable (FIGS. 2b, 3a).

It is therefore necessary to have a planarization option: in the art of semiconductor device testing the misalignment angle between the chip-plot surface and the surface through the probe tips is called "theta" (Θ, FIG. 2b); the process of aligning the probe tips with the chip-plot surface is called "theta adjustment".

In the case of coaxial wafer probes the coaxial connector of the wafer probe is connected to the test equipment (network analyzers, signal sources, power meters, etc.) using flexible coaxial cables (FIG. 4). In this case the "theta adjustment" is done using a rotating base of the probe holder and a micrometer screw to adjust the angle of the probe tips. This ensures that the probe tips, when they make contact with the chip plots leave equal marks (FIG. 3b) instead of unequal marks (FIG. 3a) when the plan of the probe (probe tips) is not parallel with the plan of the chip (wafer) plots.

However, in the case of millimeter-wave waveguide probes (FIG. 1) the above mentioned theta alignment mechanism and tool (FIG. 4) cannot be used. This is because the waveguide flange is aligned and solidly screwed on the waveguide section of the auxiliary supporting equipment (waveguide signal sources and receivers and/or impedance tuners) which are bulky and cumbersome to mobile handling and fixing under various angles and cannot rotate freely. In these cases provision must be taken for the waveguide probes to be capable of some rotation so they can be "theta aligned" before firmly fastened to the surrounding support equipment. This can be done but needs a special alignment tool and a special probe flange capturing and support apparatus. These items and alignment method are the purpose of this invention.

DESCRIPTION OF THE VARIOUS VIEWS OF THE DRAWINGS

The invention can be better understood in view of the attached drawings:

FIG. 1 depicts prior art, a wafer probe attached to a millimeter-wave waveguide transmission system.

FIG. 2 depicts prior art, mechanism of misalignment of wafer probes; shown on a waveguide probe, but valid for coaxial probes as well.

FIG. 3 depicts prior art, probe tip marks created by a a) planarity mis-aligned and b) planarity aligned probe.

FIG. 4 depicts prior art, assembly of mounting a coaxial probe on a wafer probe station.

FIG. 5 depicts a Theta (planarity angle) alignment device.

FIG. 6 depicts application of Theta alignment device; even if the probe body is aligned the probe tips may be misaligned.

FIG. 7 depicts application of Theta alignment device; the probe body must be corrected for the probe tips to be aligned.

FIG. 8 depicts a flange capturing device, aligning for waveguide flange rotation.

FIG. 9 depicts the parts composing the flange capturing device.

FIG. 10 depicts assembly of a flange capturing device on a waveguide wafer probe.

FIG. 11 depicts another view of flange capturing device and wafer probe.

FIG. 12 depicts a front view of flange capturing device.

FIG. 13 depicts a view of planarity alignment tool on a waveguide probe.

FIG. 14 depicts layout of flange modification to be compatible with the planarity angle rotation.

FIG. 15 depicts an insertion waveguide section, to be used if the instrument flange cannot be modified to allow planarity rotation.

DETAILED DESCRIPTION OF THE INVENTION

The method and apparatus used to align the plan of waveguide wafer probes with the plan of microchip plots is outlined here forth.

The alignment support tool (FIG. 5) used is a metallic or hard plastic block (parallelepiped) comprising two sections: one fixed (52) and one adjustable (51) section, having both a form of a parallelepiped. A vertical screw (53) threaded through the mobile section (51) allows adjusting continuously said movable section (51) at a certain angle relative to the surface of the fixed section (FIG. 5a). The sections are joined together at one end (54) and separated on the other. The free end (55) is then pushed away with the screw (53). The main reason for someone using two flat sections (51, 52) rather than a simple screw (53) and a single mobile section (51) as shown in FIG. 5b) is practical: to avoid leaving marks on the surface of the plate of the wafer chuck (Chip plot surface) when used to align the probe tips. Depending on the hardness of material of the chuck surface, the movable section can be omitted and leave only the top of the screw (53) protruding from the larger section (51) to define the slope (=theta angle), FIGS. 5a) and 5b).

In waveguide transmission line setups the cavities of the waveguide sections are supposed to align perfectly to each-other in order to avoid reflections and insertion loss. Theoretical simulations and practical trials have shown that a certain rotational misalignment can be tolerated without sensibly affecting the overall performance of the transition. Such tests have been carried out for "theta" angle rotational misalignments of ±3° and ±5°. It becomes obvious that at 5° a noticeable degradation of the transition quality occurs, so this is the practical limit. On the other hand the recommended "theta" correction by the probe manufacturers does not exceed ±3°.

The flange support and capture apparatus is shown in FIGS. 8 and 9. The assembly of the waveguide flanges is shown in FIGS. 10 and 11; the rotational alignment is shown in FIG. 12.

The flange capture apparatus (FIG. 9) comprises two sections: one front section (71) towards the probe flange (113), and one back section (72) towards the equipment flange (110). The purpose of front and back sections is to capture the equipment flange (110) between the front (71) and back (72) sections and secure it against the probe flange (113) without screwing on the equipment flange (110) itself. Instead of (originally) threaded holes in the equipment flange (Thread, FIG. 14a), oval slots (81), FIG. 14b are cut which allow for the probe to rotate against the equipment flange (FIG. 14). The instrument flange (110), FIG. 11, is sandwiched between the front (71), (113) and the back (72), (114) section of the capture bracket. The sandwiched instrument flange (110) carries peripheral slots (120, 121) instead of holes and threads, so it can tolerate the rotation of the probe flange (122), FIG. 12. During the alignment procedure the front (71) and back (72) sections of the capture tool (bracket) are loosened slightly. Once in position they are tightened using the front screws (111, 112). The opening (73) in the (bracket, (72)) support tool allows for passing the (bracket) tool over the waveguide.

The modifications required to one of both waveguide flanges (preferably the instrument flange, since this would allow exchanging waveguide probes without modifying each one of them) is shown in FIG. 14. FIG. 14a) shows the original layout of any waveguide flange and FIG. 14b) shows the required modifications to be made. If the instrument flange itself cannot be modified with the instrument attached, a waveguide transition section can be introduced, of which one flange remains unmodified and one is modified as per FIG. 14. Such an insertion section used to match one modified and one unmodified flange is shown in FIG. 15.

The method for aligning the probe tip plane comprises the following steps: in a first step the probes are placed flat (parallel) to the wafer/chuck surface (83); this is done by using the alignment tool (81) (FIG. 6) as a pure parallelepiped (the adjusting screw (82) is fully retracted); the front screws (111, 112) of the flange are loosened so the probe can rotate when pressed down hard on the alignment tool (51), so their body is parallel to the chuck surface (this takes place in a section of the chuck where there is no semiconductor wafer);

in a second step the probes are lifted and the wafer is placed such as for the tips to hover over the chip plots; then the probes are lowered to make contact with the chip plots and lifted again leaving marks on the chip plots (FIG. 6); the marks of the probe tips are assessed visually through the microscope (FIG. 3) by the operator;

in a third and following steps and with some trials the intensity of the marks is assessed and related to the associated misalignment of the probe tips and the required "theta" correction (FIG. 7); the screw in the alignment tool is adjusted such as to create the expected "theta" angle in the tool (FIG. 7); then the probes are moved away from the wafer, loosened from the rigid flange and again pressed down on the alignment tool, to adapt to the slope (theta) of the tool and fastened to the auxiliary equipment connectors (FIG. 7); the probes are moved again over the wafer and lowered to make contact, leaving marks on the chip plots, which are then assessed visually under the microscope; depending on the intensity (diameter) of the tip marks on the wafer plots (FIG. 3) the "theta" angle of the alignment tool is re-adjusted and the procedure is repeated starting with the third and following steps.

Obvious alternatives to this planarity alignment method, in particular the non-obvious allowance for waveguide sections to be axially rotated relative to each-other shall not impede on the validity of the present invention.

What is claimed is:

1. A holding bracket comprising capturing the flanges of two waveguide sections, a front flange and a rear flange, wherein the front flange and the rear flange are attached to each-other by a plurality of holding screws and positioning pins that are diametrically opposed and alternate in position around the waveguide axis;

said bracket comprising two halves which are a front half part and a rear half part, whereby the front half part captures the front flange and the rear part captures the rear flange, whereby the rear flange is unmodified, and whereby the front flange is modified as follows:

a) the positioning pins are removed;

b) the threads of the holding screws and the holes receiving the positioning pins of the rear flange are enlarged to form concentric oval holes.

2. A holding bracket as in claim 1, wherein the holes receiving the positioning pins and the holding screw threads of the front flange are modified to oval slots allowing for a +/−5 degree axial rotation of the flanges;

and whereby said holding bracket allows the waveguide flanges, sandwiched between its front and rear halves parts, to be misaligned by axial rotation against each other by up to +1-5 degrees and secured by tightening the holding screws.

3. A device for wafer probe Theta adjustment comprising two parallelepiped blocks, a top and a bottom block, said blocks being joined at one end and separated at the opposing end;

and a screw having a perpendicular orientation which threads through the top and bottom block, wherein said screw is traversing the top block at the opposing end and allowing pushing away of the bottom block from the top block, thus allowing adjustment of a theta angle between the planes of the top and bottom blocks.

4. A device as in claim 3 wherein the top and bottom blocks are made of metal.

5. A device as in claim 3 wherein the top and bottom blocks are made of hard plastic.

6. A method for Theta adjustment of a plurality of waveguide wafer probes having probe tips to be planar on a semiconductor wafer supported by a wafer chuck, by theta correction of planar misalignment for said plurality of probe tips, said probe tips being mounted in a probe housing wherein said probe housing is attached to a section of waveguide transmission line, which terminates with a front flange #1, wherein said front flange #1 is attached to a rear waveguide flange #2 of an adjacent instrument using holding screws and holding bracket as in claim 1, comprises the following steps:
   a) loosen the holding screws between the front and rear flanges;
   b) insert an alignment device as in claim 3, wherein said alignment device comprises two parallelepiped blocks, a top and a bottom block, said blocks being joined at one end and separated at the opposing end; and a screw having a perpendicular orientation which threads through the top and bottom block, wherein said screw is traversing the top block at the opposing end and allowing pushing away of the bottom block from the top block, thus allowing adjustment of an theta angle between the planes of the top and bottom blocks, and between the surface of the wafer chuck and the housing of the wafer probe; wherein said alignment device is inserted under the probe housing;
   c) align the bottom of the probe housing with the top block of the alignment device and tighten the holding screws of said flanges captured by the holding bracket as in claim 1;
   d) insert a semiconductor wafer under said probe to make contact with the probe tips;
   e) lift the probe and verify the planarity of the probe tips by visually inspecting the three marks made by the probe tips on the semiconductor wafer;
   f) determine if the marks on the semiconductor wafer are approximately equal, and determine if the probe tips show planarity, and determine if no further adjustment is needed by the alignment device,
   g) determine if the marks are unequal, determine and adjust the angle between top and bottom blocks of the alignment device by turning said screw; and
   h) repeat the method recited in steps a) through g) until the tip marks on the semiconductor wafer are approximately equal.

7. A method for Theta adjustment of waveguide wafer probes having the plurality of probe tips to be planar on a semiconductor wafer supported by a wafer chuck, by Theta correction of planar misalignment for said plurality of probe tips, as in claim 6, further comprising modifying the front flange #1 or rear flange #2 as follows:
   a) remove the two sets of diametrically opposed positioning pins;
   b) expand the holes of the circular holding screws to larger oval slots, to allow for a +/−5 degree rotation of the flanges, and
   c) expand the holes for the circular positioning pins to larger oval slots to allow for a +/−5 degree rotation of the flanges.

* * * * *